(12) United States Patent
Reingruber et al.

(10) Patent No.: US 10,741,486 B2
(45) Date of Patent: Aug. 11, 2020

(54) ELECTRONIC COMPONENTS HAVING THREE-DIMENSIONAL CAPACITORS IN A METALLIZATION STACK

(71) Applicant: Intel IP Corporation, Santa Clara, CA (US)

(72) Inventors: Klaus Reingruber, Langquaid (DE); Sven Albers, Regensburg (DE); Christian Geissler, Teugn (DE)

(73) Assignee: Intel Corporation, Santa Clara, CA (US)

( * ) Notice: Subject to any disclaimer, the term of this patent is extended or adjusted under 35 U.S.C. 154(b) by 1001 days.

(21) Appl. No.: 15/062,143

(22) Filed: Mar. 6, 2016

(65) Prior Publication Data
US 2017/0256480 A1    Sep. 7, 2017

(51) Int. Cl.
*H01L 23/498* (2006.01)
*H01L 23/00* (2006.01)
(Continued)

(52) U.S. Cl.
CPC .... *H01L 23/49838* (2013.01); *H01L 21/4846* (2013.01); *H01L 21/565* (2013.01); *H01L 23/49822* (2013.01); *H01L 23/49827* (2013.01); *H01L 23/49833* (2013.01); *H01L 24/17* (2013.01); *H01L 24/19* (2013.01); *H01L 24/20* (2013.01); *H01L 24/81* (2013.01); *H05K 1/162* (2013.01); *H01L 23/3128* (2013.01); *H01L 23/49816* (2013.01); *H01L 23/5223* (2013.01); *H01L 23/5385* (2013.01);
(Continued)

(58) Field of Classification Search
CPC .......... H01G 4/015; H01G 4/008; H01G 4/18; H01G 4/252; H01L 23/49838; H01L 21/4846; H01L 21/565; H01L 23/49822; H01L 23/49827; H01L 23/49833; H01L 24/17; H01L 24/81; H01L 23/3128; H01L 23/49816; H01L 23/5223; H01L 23/5385; H01L 2224/16227; H01L 2224/16265; H01L 2924/15311; H01L 2924/19041; H01L 2924/19101; H05K 1/162
USPC ...................................................... 361/273
See application file for complete search history.

(56) References Cited

U.S. PATENT DOCUMENTS

| 2002/0084479 | A1 | 7/2002 | Pan et al. |
| 2004/0238934 | A1 | 12/2004 | Warner et al. |

(Continued)

OTHER PUBLICATIONS

International Search Report and Written Opinion issued in PCT Application No. PCT/US2017/015513 dated Apr. 25, 2017; 12 pages.
QuickiWiki, "Elektrolytkondensator," http://www.quickiwiki.com/de/Elektrolytkondensator, [Jan. 22, 2016], 21 pages.
Wojnowski, et al.; "High-Inductors Embedded in the Fan-Out Area of an eWLB," Components, Packaging and Manufacturing Technology, IEEE Transactions; vol. 2, Issue 8, Abstract only, Mar. 2, 2012, pp. 1280-1291.

(Continued)

*Primary Examiner* — Michael P McFadden
(74) *Attorney, Agent, or Firm* — Patent Capital Group

(57) ABSTRACT

Disclosed herein are electronic components having three-dimensional capacitors disposed in a metallization stack, as well as related methods and devices. In some embodiments, for example, an electronic component may include: a metallization stack and a capacitor disposed in the metallization stack wherein the capacitor includes a first conductive plate having a plurality of recesses, and a second conductive plate having a plurality of projections, wherein individual projections of the plurality of projections extend into corresponding individual recesses of the plurality of recesses without contacting the first conductive plate.

25 Claims, 6 Drawing Sheets

(51) Int. Cl.
*H01L 21/48* (2006.01)
*H01L 21/56* (2006.01)
*H05K 1/16* (2006.01)
*H01L 23/538* (2006.01)
*H01L 23/31* (2006.01)
*H01L 23/522* (2006.01)

(52) U.S. Cl.
CPC .............. *H01L 24/13* (2013.01); *H01L 24/16* (2013.01); *H01L 24/29* (2013.01); *H01L 24/32* (2013.01); *H01L 24/73* (2013.01); *H01L 24/83* (2013.01); *H01L 2224/13101* (2013.01); *H01L 2224/16227* (2013.01); *H01L 2224/16265* (2013.01); *H01L 2224/2919* (2013.01); *H01L 2224/73204* (2013.01); *H01L 2224/81801* (2013.01); *H01L 2224/8385* (2013.01); *H01L 2924/1304* (2013.01); *H01L 2924/13091* (2013.01); *H01L 2924/14* (2013.01); *H01L 2924/15174* (2013.01); *H01L 2924/15192* (2013.01); *H01L 2924/15311* (2013.01); *H01L 2924/181* (2013.01); *H01L 2924/19041* (2013.01); *H01L 2924/19101* (2013.01)

(56) References Cited

U.S. PATENT DOCUMENTS

| | | |
|---|---|---|
| 2005/0266652 A1 | 12/2005 | Chudzik et al. |
| 2009/0231820 A1* | 9/2009 | Tanaka ............. H01L 23/49822 361/764 |
| 2012/0055706 A1* | 3/2012 | Mok .................... H01G 4/228 174/260 |
| 2013/0277803 A1* | 10/2013 | Pagani ............... H01L 23/5223 257/532 |
| 2014/0145299 A1 | 5/2014 | Kalnitsky et al. |
| 2014/0217549 A1* | 8/2014 | Tzeng ................. H01L 23/147 257/532 |
| 2015/0022174 A1 | 1/2015 | Nikitin |
| 2015/0102477 A1* | 4/2015 | Qian ................. H01L 23/49827 257/676 |
| 2015/0318344 A1 | 11/2015 | Wang et al. |
| 2016/0372449 A1* | 12/2016 | Rusu ................. H01L 23/5227 |

OTHER PUBLICATIONS

Taiwan Office Action & Search Report in Taiwan Patent Application No. 106102151 dated Apr. 15, 2020, 9 pages.

* cited by examiner

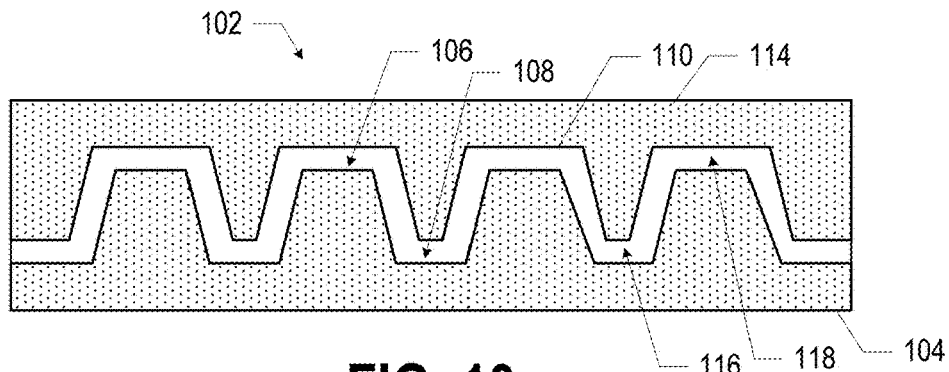

FIG. 10

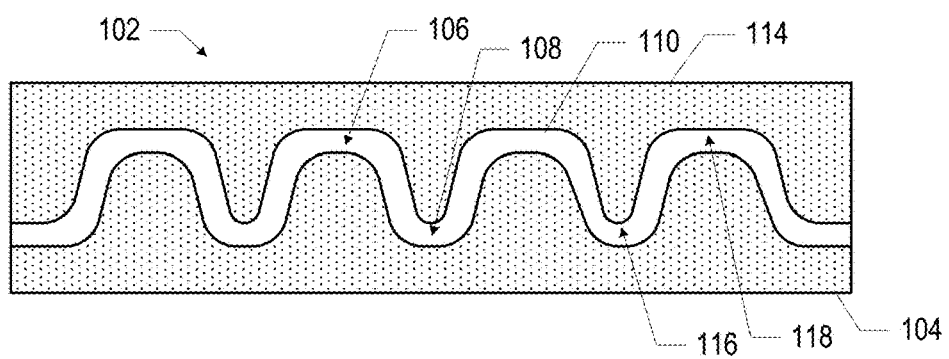

┌─────────────────────────────────────┐
│ Form a first conductive plate in a package │
│ redistribution layer, wherein the first conductive plate │
│ has a recess │
│ 1202 │
└─────────────────────────────────────┘
                    ↓
┌─────────────────────────────────────┐
│ Provide a dielectric material on the first conductive │
│ plate │
│ 1204 │
└─────────────────────────────────────┘
                    ↓
┌─────────────────────────────────────┐
│ Form a second conductive plate in the package │
│ redistribution layer on the dielectric material, wherein │
│ the second plate has a projection extending into the │
│ recess and spaced apart from the recess by the │
│ dielectric material │
│ 1206 │
└─────────────────────────────────────┘

ELECTRONIC COMPONENTS HAVING THREE-DIMENSIONAL CAPACITORS IN A METALLIZATION STACK

TECHNICAL FIELD

The present disclosure relates generally to the field of electronic components, and more particularly, to electronic components having three-dimensional capacitors in a metallization stack.

BACKGROUND

Capacitors are used in many different electronic device designs. These capacitors are typically separately fabricated and surface mounted to a substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 10 and 11 are cross-sectional side views of various examples of three-dimensional capacitors that may be included in the metallization stack of FIG. 1, in accordance with various embodiments.

FIG. 12 is a flow diagram of a method of manufacturing an IC device having a three-dimensional capacitor in a metallization stack, in accordance with various embodiments.

DETAILED DESCRIPTION

Figure 1:
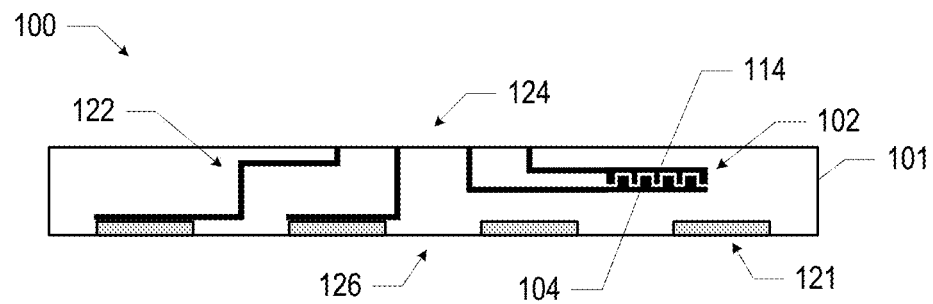
FIG. 1 is a cross-sectional side view of a metallization stack having a three-dimensional capacitor disposed therein, in accordance with various embodiments.

Disclosed herein are electronic components having three-dimensional capacitors disposed in a metallization stack, as well as related methods and devices. In some embodiments, for example, an electronic component may include: a metallization stack and a capacitor disposed in the metallization stack, wherein the capacitor includes a first conductive plate having a plurality of recesses, and a second conductive plate having a plurality of projections, wherein individual projections of the plurality of projections of the second conductive plate extend into corresponding individual recesses of the plurality of recesses without contacting the first conductive plate.

As noted above, capacitors are commonly included in electronics packages as surface-mount devices electrically coupled through a substrate to a die. Surface-mount capacitors, however, may have a footprint (and sometimes a height) that limits how small of a form factor can be achieved for the overall device (e.g., a mobile or wearable device), and thus the use of surface-mount capacitors may not be able to satisfy small form factor requirements. Additionally, the distance between the surface-mount capacitors and the in-die electronics that utilize the capacitors may result in substantial parasitics that introduce noise and lower signal quality, resulting in reduced performance.

Various ones of the embodiments disclosed herein may provide improved capacitors for inclusion in any of a number of electronic components. For example, various ones of the embodiments disclosed herein may reduce the parasitics, cost, and size of IC packages relative to conventional capacitor techniques, while providing greater capacitance than "planar" capacitors. In particular, the three-dimensional capacitors disclosed herein may effectively increase the overall area between two plates of a capacitor relative to a planar capacitor, thereby providing a greater capacitance for the same footprint. Additionally, in some applications, positioning these capacitors in the redistribution layer of a package improves on the parasitics incurred by surface-mount capacitors without incurring the expense and complexity of in-die capacitors.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The drawings are not necessarily to scale.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, a "redistribution layer" may refer to a portion of an electronic component that provides electrical pathways to make conductive contacts in the electronic component available in other locations in or on the package.

FIG. 1 is a cross-sectional side view of a metallization stack 100 having a three-dimensional capacitor 102 disposed therein, in accordance with various embodiments. The terms "three-dimensional capacitor 102" and "capacitor 102" may be used interchangeably herein. The metallization stack 100 may be formed of a dielectric material 101, and may have conductive pathways 122 extending from a first face 124 of the metallization stack 100 through the dielectric material 101. In some embodiments, when the metallization stack 100 is a package redistribution layer, one or more dies may be coupled to the first face 124 (e.g., as discussed below with reference to FIGS. 4 and 5). In some embodiments, when the metallization stack 100 includes interconnect layers or other back-end metal, transistors and/or other front-end devices in a device layer may be coupled to the first face 124, as discussed below with reference to FIG. 14. Some of these conductive pathways 122 may couple to a conductive contact 121 disposed at the second face 126 of the metallization stack 100, while others of these conductive pathways 122 may couple to the capacitor 102. When the metallization stack 100 includes interconnect layers or other back-end metal, the conductive contacts 121 may include bond pads, as discussed below with reference to FIG. 14.

The capacitor 102 may include a first plate 104 and a second plate 114, with one conductive pathway 122 coupled to the first plate 104 and another conductive pathway 122 coupled to the second plate 114. Each of the plates 104 and 114 may be formed of a conductive material (e.g., a metal, such as copper), and the plates 104 and 114 may be spaced apart to enable the storage of energy in the capacitor 102 via the differential charge stored at the plates 104 and 114. In some embodiments, the plates 104 and 114 may be formed as part of different metallization layers in the metallization stack 100. The conductive pathways 122 may be formed of a metal (e.g., copper) and may include conductive traces, vias, or any other suitable structure for routing electrical signals. In some embodiments, the capacitor 102 may be disposed strictly between the first face 124 and the second face 126 of the metallization stack 100 (e.g., such that the capacitor 102 is disposed between portions of the dielectric material 101), while in other embodiments, the capacitor 102 may be disposed at the first face 124 or the second face 126. For example, the capacitor 102 may be disposed at the first face 124 so that the second plate 114 of the capacitor 102 may be in physical contact with a conductive contact of a die disposed on the first face 124 (not shown in FIG. 1). Although a single capacitor 102 is illustrated in various ones of the accompanying figures, a metallization stack 100 may include one or more capacitors 102.

Figure 2:
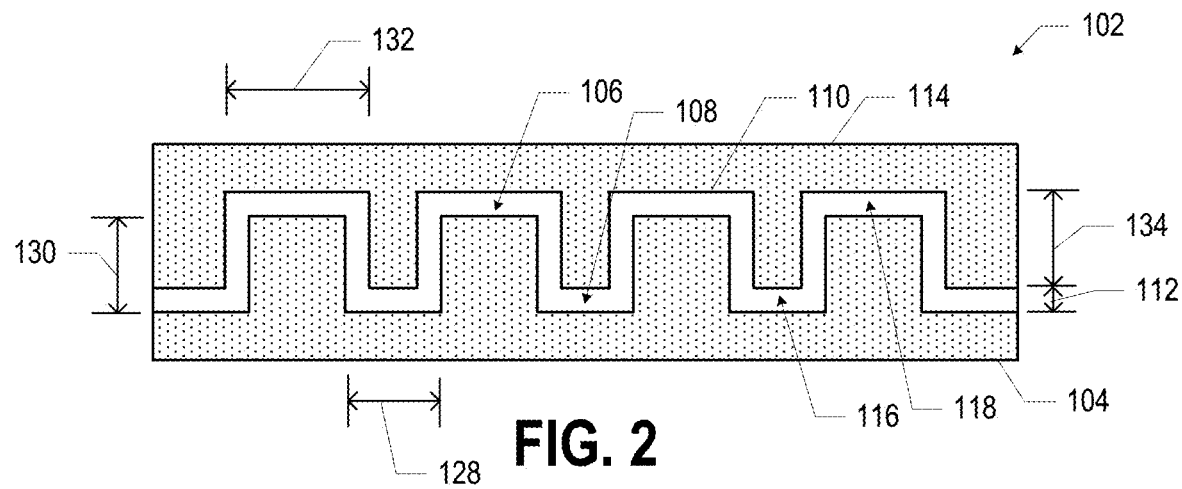
FIG. 2 is a cross-sectional side view of an example three-dimensional capacitor that may be included in the metallization stack of FIG. 1, in accordance with various embodiments.

One or more of the plates 104 and 114 may have a three-dimensional structure. For example, FIG. 2 is a cross-sectional side view of an example three-dimensional capacitor 102 that may be included in the metallization stack 100 of FIG. 1, in accordance with various embodiments. The first plate 104 of the capacitor 102 of FIG. 2 may have one or more recesses 108 and one or more projections 106. The second plate 114 of the capacitor 102 of FIG. 2 may have one or more recesses 118 and one or more projections 116, and the plates 104 and 114 may be arranged so that individual ones of the projections 106 extend into individual ones of the recesses 118, and individual ones of the projections 116 extend into individual ones of the recesses 108. A dielectric material 110 (which may be the same dielectric material as the dielectric material 101) may be disposed between the plates 104 and 114.

The recesses 108 and 118, and the projections 106 and 116, of the capacitor 102 may have any suitable dimensions. In some embodiments, the widths and/or depths of different ones of the recesses 108 (or the recesses 118) may be different, while in other embodiments, the widths and/or depths of different ones of the recesses 108 (or the recesses 118) may be substantially the same (e.g., within manufacturing tolerances, which may be 20-25% in some applications). For example, FIG. 2 illustrates an embodiment in which all of the recesses 108 have a same width 128, and all of the recesses 118 have a same width 132; however, the width 128 is not the same as the width 132. In other embodiments, the width 128 may be the same as the width 132. In some embodiments, the width 128 and/or the width 132 may be between 3 and 25 microns (e.g., between 5 and 20 microns), for example.

In some embodiments, the widths and/or heights of different ones of the projections 106 (or the projections 116) may be different, while in other embodiments, the widths and/or heights of different ones of the projections 106 (or the projections 116) may be substantially the same. For example, FIG. 2 illustrates an embodiment in which all of the projections 106 have a height 130, and all of the projections 116 have a height 134. In some embodiments, the height 130 may be approximately the same as the height 134, while in other embodiments, the height 130 may be different from the height 134. In some embodiments, the height 130 and/or the height 134 may be between 3 and 25 microns (e.g., between 5 and 20 microns), for example.

The dielectric material 110 disposed between the first plate 104 and the second plate 114 may have a uniform thickness, or a non-uniform thickness. In the embodiment illustrated in FIG. 2, the dielectric material 110 has a substantially uniform thickness 112 that defines the separation between proximate regions of the first plate 104 and the second plate 114. This thickness 112 may be, for example between 5 and 10 microns. In some embodiments, the dielectric material 110 may extend between the first plate 104 and the second plate 114, contacting both plates. In such embodiments, the distance between the first plate 104 and the second plate 114 may be defined by the thickness of the dielectric material 110. In some embodiments in which the distance between the first plate 104 and the second plate 114 is non-uniform (e.g., as discussed below with reference to FIGS. 10 and 11), the minimum distance between the first plate 104 and the second plate 114 may be between 5 and 10 microns, and/or the maximum distance between the first plate 104 and the second plate 114 may be between 5 and 10 microns.

Figure 3A:
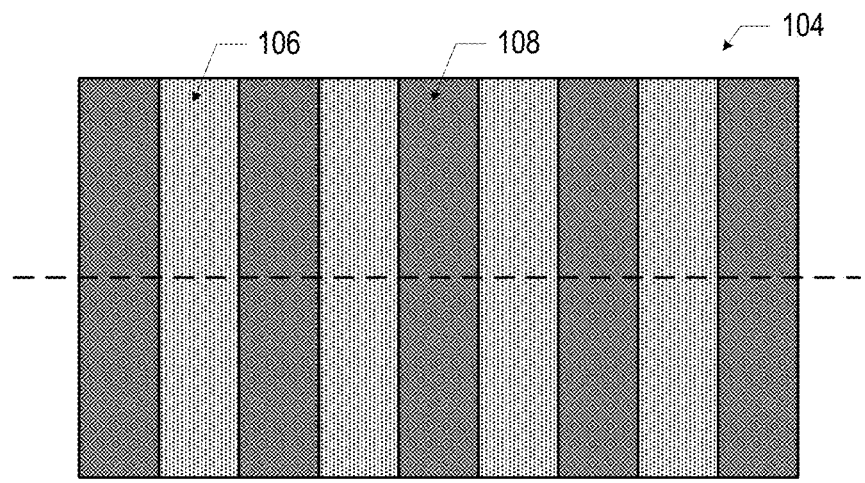
FIGS. 3A and 3B are top views of example plates of a three-dimensional capacitor that may be included in the metallization stack of FIG. 1, in accordance with various embodiments.

The number of projections 106, recesses 108, projections 116, and recesses 118 in a capacitor 102 may take any suitable values. Additionally, the projections 106, recesses 108, projections 116, and recesses 118 may be arranged in any desired way two-dimensionally between the first face 124 and the second face 126 of the metallization stack 100. For example, FIG. 3A is a top view of an embodiment of the first plate 104 of the capacitor 102 of FIG. 1, in accordance with various embodiments. The top view illustrated in FIG. 3A depicts projections 106 and recesses 108 arranged one-dimensionally in a parallel ridge pattern. The particular number of projections 106 and recesses 108 in the first plate 104 may take any suitable values.

Figure 3B:
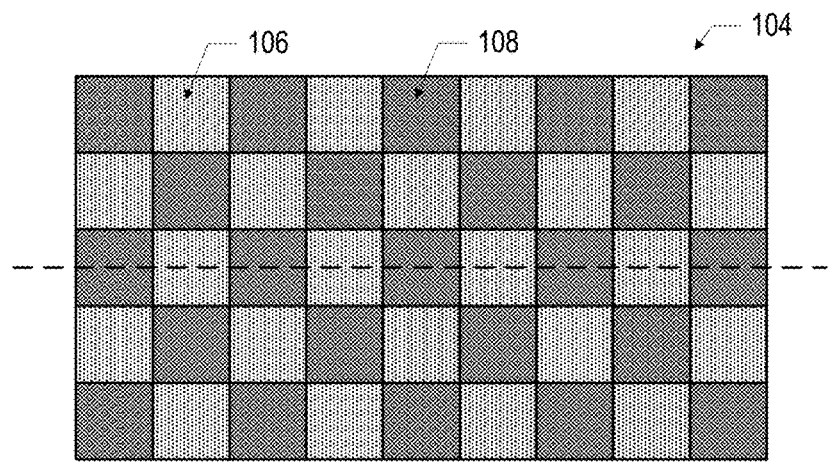

In another example, FIG. 3 is a top view of an embodiment of the first plate 104 of the capacitor 102 of FIG. 1, in accordance with various embodiments. The top view illustrated in FIG. 3 depicts projections 106 and recesses 108 arranged two-dimensionally in a checkerboard pattern. The particular number of projections 106 and recesses 108 in the first plate 104 may take any suitable values. Comparing the embodiments of FIGS. 3A and 3B, the embodiment of FIG. 3A may have fewer pairs of facing sidewalls to contribute to the effective area of the capacitor 102 than the embodiment of FIG. 3B, but may be less complex to manufacture. The footprint of the first plate 104 need not be a rectangle (as illustrated in FIGS. 3A and 3B), but may take any desired form (with or without the projections 106 and recesses 108 arranged in a parallel ridge or checkerboard pattern). For the embodiments illustrated in FIGS. 3A and 3B, the pattern of projections 116 and recesses 118 of the second plate 114 (not shown) may be complementary to the pattern of projections 106 and recesses 108 of the first plate 104 (e.g., as illustrated in FIG. 2).

In a conventional, planar capacitor (in which two flat, parallel plates each having an area A are spaced apart by a distance d by a dielectric material having a permittivity e), the capacitance C is given by:

$$C=eA/d$$

In the embodiments disclosed herein, the top surfaces of the projections 106 and the bottom surfaces of the recesses 118 provide a set of approximate parallel plate capacitors, as do the bottom surfaces of the recesses 108 and the top surfaces of the projections 116. In particular, if the capacitor 102 has a footprint of A (e.g., as viewed from the top, as in FIGS. 3A and 3B), the dielectric material 110 has a permittivity e, and the thickness 112 is d, the capacitance contributed by these portions of the capacitor 102 is approximately equal to eA/d (the standard parallel plate capacitor). However, the three-dimensional structure of the capacitor 102 includes additional parallel surfaces that contribute additional capacitance to the capacitor 102—namely, the sidewalls of the recesses 108 that face corresponding sidewalls of the recesses 118. Each of these pairs of facing sidewalls increases the capacitance of the capacitor 102 above eA/d, with the amount of increase dependent upon the number of facing sidewalls, the area of the facing sidewalls, and their separation (also calculated in accordance with the general eA/d expression). For example, if a capacitor 102 has a 5×9 checkerboard pattern of squares, as illustrated in FIG. 3B, the heights 130 and 134 are each equal to 1 length unit (LU), the widths 128 and 132 are each equal to 1 LU, and the thickness 112 is assumed to be smaller relative to 1 LU, the "effective" surface area of this capacitor 102 is approximately 5×9 LU plus 76×1×1 LU (where 76 is the number of pairs of facing sidewalls), which equals 121 $LU^2$, more than 228% of the area of a standard parallel plate capacitor having the same footprint (45 $LU^2$). In this manner, substantial increases in capacitance may be achieved without increasing the footprint of the capacitor.

Figure 4:
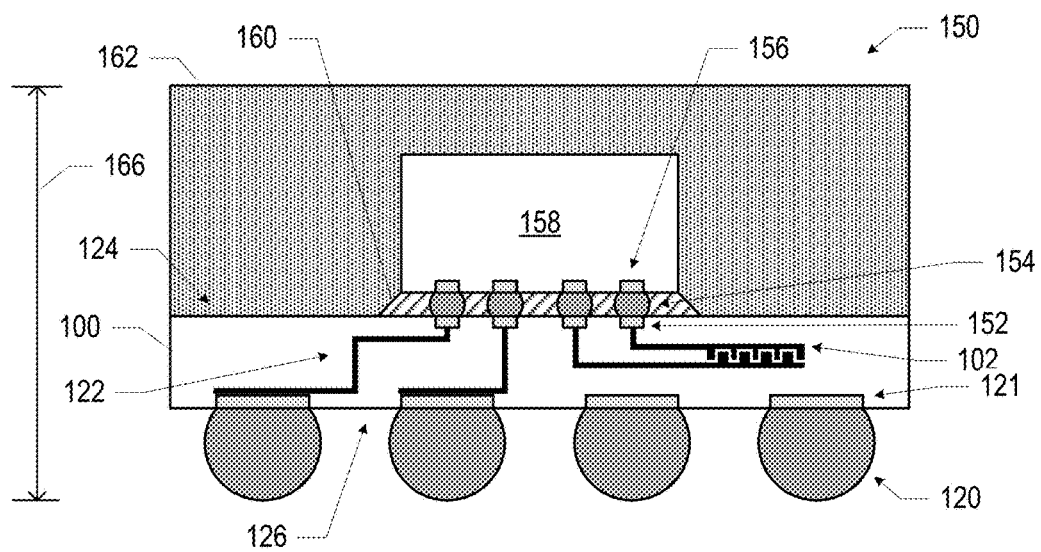
FIG. 4 is a cross-sectional side view of a flip chip integrated circuit (IC) package including a package metallization stack having a three-dimensional capacitor disposed therein, in accordance with various embodiments.
Figure 5:
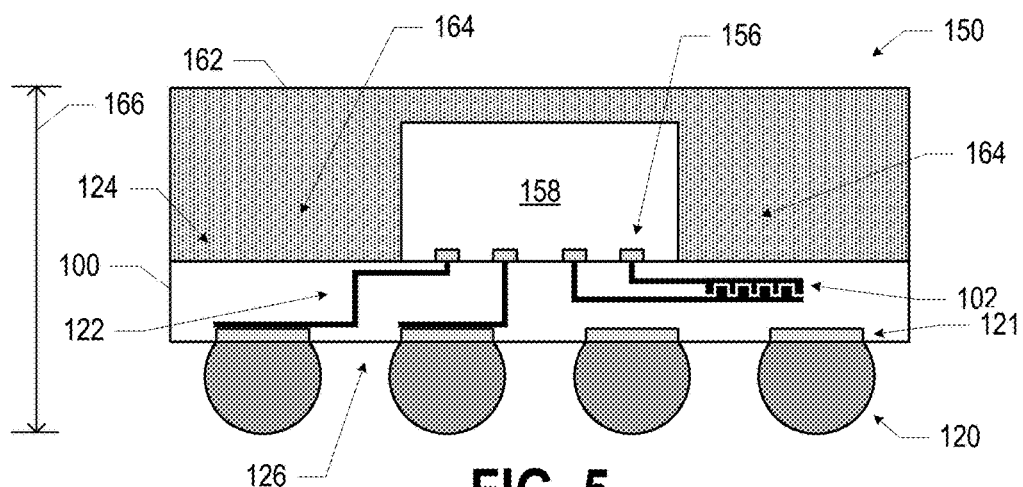
FIG. 5 is a cross-sectional side view of an embedded wafer level ball grid array (eWLB) IC package including a package metallization stack having a three-dimensional capacitor disposed therein, in accordance with various embodiments.

A metallization stack 100 (including one or more capacitors 102) may be included in any suitable electronic component. For example, the electronic component may be a die, and the metallization stack 100 may take the form of metal layers in the die, as discussed below with reference to FIG. 14. In another example, the metallization stack 100 may be included in a wafer-level chip scale package (WLCSP) or a panel fanout (FO) package as a package redistribution layer. FIGS. 4 and 5 illustrate different types of IC packages 150 that may include the metallization stack 100 in the form of a package redistribution layer. FIG. 4 is a cross-sectional side view of a flip chip IC package 150 including a metallization stack 100 having a three-dimensional capacitor 102 disposed therein, in accordance with various embodiments. The capacitor 102 of the embodiment of FIG. 4 may take any of the forms disclosed herein. For example, the capacitor 102 may include a first plate 104 having a recess 108, and a second plate 114 having a projection 116 that extends into the recess 108 without contacting the first plate 104. The IC package 150 of FIG. 4 may include a die 158 coupled to the metallization stack 100 via conductive contacts 156 of the die 158, first-level interconnects 154, and conductive contacts 152 of the metallization stack 100. The conductive contacts 152 may be coupled to the conductive pathways 122, allowing circuitry within the die 158 to electrically couple to various ones of the conductive contacts 121 or to the capacitor 102. The first-level interconnects 154 illustrated in FIG. 4 are solder bumps, but any suitable first-level interconnects 154 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some embodiments, an underfill material 160 may be disposed between the die 158 and the metallization stack 100 around the first-level interconnects 154, and a mold compound 162 may be disposed around the die 158 and in contact with the metallization stack 100. In some embodiments, the underfill material 160 may be the same as the mold compound 162. Example materials that may be used for the underfill material 160 and the mold compound 162 are epoxy mold materials, as suitable. Second-level interconnects 120 may be coupled to the conductive contacts 121. The second-level interconnects 120 illustrated in FIG. 4 are solder balls (e.g., for a ball grid array arrangement), but any suitable second-level interconnects 120 may be used (e.g., pins in a pin grid array arrangement or lands in a land grid array arrangement). The second-level interconnects 120 may be used to couple the IC package 150 to another component, such as a circuit board (e.g., a motherboard), an interposer, or another IC package, as known in the art. The IC package 150 may have a height 166; in some embodiments, the height 166 may be less than 1 millimeter (e.g., between 0.5 and 1 millimeter).

FIG. 5 is a cross-sectional side view of an embedded wafer level ball grid array (eWLB) IC package 150 including a metallization stack 100 having a three-dimensional capacitor 102 disposed therein, in accordance with various embodiments. The capacitor 102 of the embodiment of FIG.

5 may take any of the forms disclosed herein. For example, the capacitor 102 may include a first plate 104 having a recess 108, and a second plate 114 having a projection 116 that extends into the recess 108 without contacting the first plate 104. The IC package 150 of FIG. 5 may include a die 158 coupled to the metallization stack 100 via conductive contacts 156 of the die 158; as known in the art of eWLB, the metallization stack 100 may be "built up" on the die 158. The conductive contacts 156 may be coupled to the conductive pathways 122, allowing circuitry within the die 158 to electrically couple to various ones of the conductive contacts 121 or to the capacitor 102.

The mold compound 162, the second-level interconnects 120, and the height 166 may take the form of any of the embodiments discussed above with reference to FIG. 4. The mold compound 162 of the embodiment of FIG. 5 may include fanout areas 164 disposed around the die 158. In some embodiments, one or more of the capacitors 102 included in the metallization stack 100 may be disposed proximate to the fanout areas 164 (e.g., between the fanout areas 164 and the second face 126 of the metallization stack 100, outside of the "shadow" of the die 158).

Although a single die 158 is illustrated in the IC packages 150 of FIGS. 4 and 5, these IC packages 150 may include multiple dies 158, with one or more of the multiple dies 158 coupled to capacitors 102 included in the metallization stack 100. In some embodiments, the dies 158 may themselves include capacitors 102 in their back-end metal stacks, as discussed above with reference to FIG. 14. The IC packages 150 may include additional passive components, such as "surface mount" resistors, capacitors, and inductors disposed on the first face 124 of the metallization stack. More generally, the IC packages 150 may include any other active or passive components known in the art.

Any suitable manufacturing techniques may be used to form the capacitors 102 in the metallization stacks 100, as disclosed herein. FIGS. 6-9 illustrate various operations in an example process for manufacturing the three-dimensional capacitor 102 of FIG. 2, in accordance with various embodiments. Although the example process discussed below with reference to FIGS. 6-9 has the first plate 104 being formed before the second plate 114, the operations of this process may be reversed in accordance with the teachings herein. For example, when the capacitor 102 is included in the metallization stack 100 of an eWLB IC package 150 (e.g., in the form of a package redistribution layer, as discussed above with reference to FIG. 5), the second plate 114 may be formed before the first plate 104 (e.g., as the metallization stack 100 is "built up" on the die 158). Additionally, only the operations related to the construction of the capacitor 102 are illustrated below with reference to FIGS. 6-9; these operations will generally be performed during the fabrication of the metallization stack 100, as known in the art.

Figure 6:
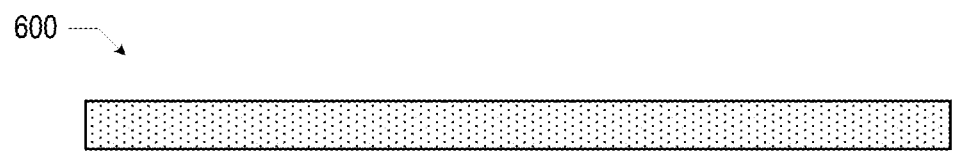
FIGS. 6-9 illustrate various operations in an example process for manufacturing the three-dimensional capacitor of FIG. 2 in a metallization stack, in accordance with various embodiments.

FIG. 6 illustrates a first portion 600 of conductive material. This first portion 600 may be substantially planar, and may be formed using any suitable metal deposition process known in the art (for example, known lithography and etch techniques). In some embodiments, the first portion 600 may be formed of copper.

Figure 7:
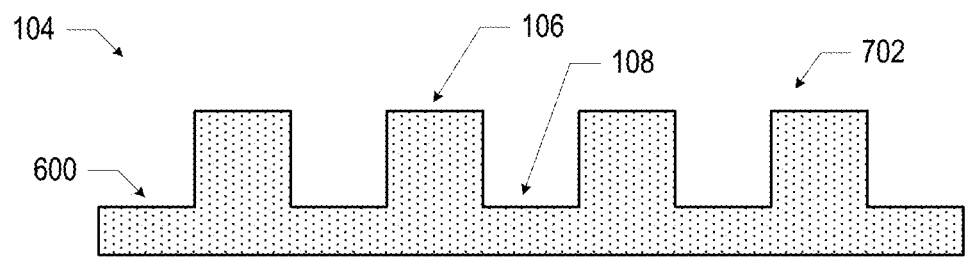

FIG. 7 illustrates the first plate 104 subsequent to providing a second portion 702 of conductive material on the first portion 600 of conductive material (FIG. 6). The second portion 702 may be formed by patterned metal deposition (e.g., using known lithography and etch techniques). The second portion 702 and the first portion 600 may together form the first plate 104, with the projections 106 and the recesses 108. The first plate 104 of FIG. 7 may take the form of any of the first plates 104 disclosed herein. In some embodiments, the first plate 104 may be part of a metallization layer of the metallization stack 100, and may be formed along with other metal structures in that metallization layer.

Figure 8:
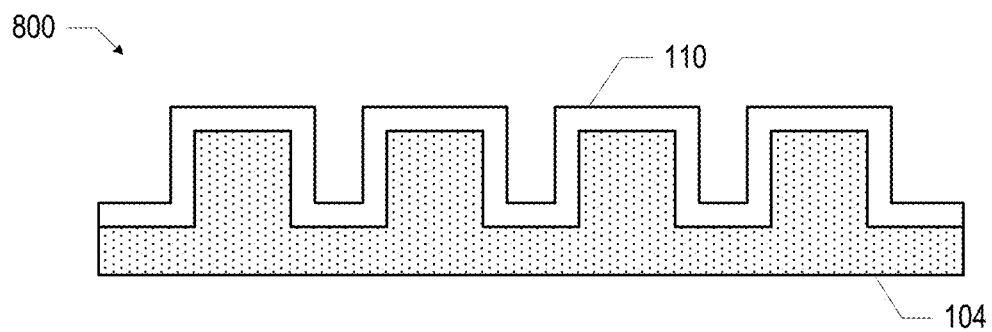

FIG. 8 illustrates an assembly 800 subsequent to providing a layer of dielectric material 110 on the first plate 104 (FIG. 7). In some embodiments, the layer of dielectric material 110 may be a conformal layer that distributes itself over the first plate 104. For example, the layer of dielectric material 110 may be spray-coated on the first plate 104 to a desired thickness. In other embodiments, the layer of dielectric material 110 may be patterned onto the first plate 104 using known lithography and etch techniques to achieve a profile that follows the projections 106 and recesses 108 of the first plate 104, as shown. The layer of dielectric material 110 of FIG. 8 may take the form of any of the embodiments of the dielectric material 110 disclosed herein.

Figure 9:
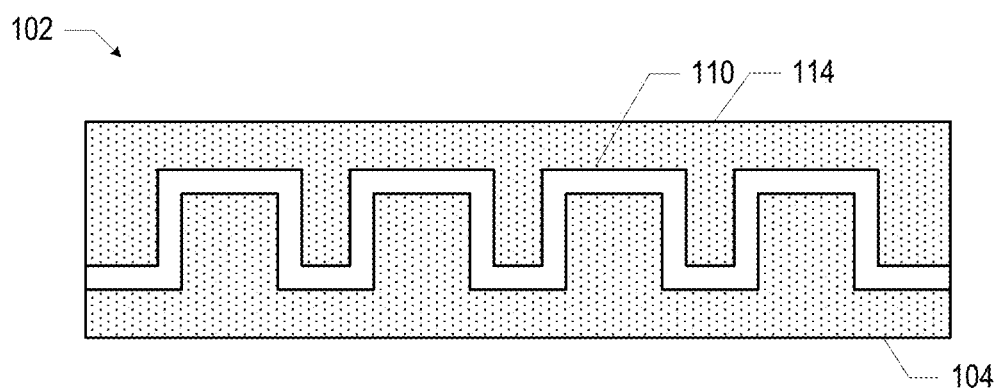

FIG. 9 illustrates a capacitor 102 subsequent to providing the second plate 114 on the assembly 800 (FIG. 8). The second plate 114 may be formed by any suitable metal deposition technique, for example. The capacitor 102 illustrated in FIG. 9 may take the form of the capacitor 102 discussed above with reference to FIG. 2). In some embodiments, the second plate 114 may be part of a metallization layer of the metallization stack 100, and may be formed along with other metal structures in that metallization layer. This metallization layer may be different from the metallization layer of the first plate 104.

The capacitor 102 illustrated in FIG. 2 has recesses 108 and 118 with sidewalls that are at right angles to the bottoms of the recesses 108 and 118, and also has projections 106 and 116 whose top surfaces are at right angles to the sidewalls. This is simply for ease of illustration, and in many embodiments, the bottoms of the recesses 108 and 118, the sidewalls of the recesses 108 and 118, and the top surfaces of the projections 106 and 116 may be curved and/or angled. For example, FIGS. 10 and 11 are cross-sectional side views of various embodiments of a three-dimensional capacitor 102 that may be included in a metallization stack 100, in accordance with various embodiments. In the embodiment of FIG. 10, the bottoms of the recesses 108 and 118, the sidewalls of the recesses 108 and 118, and the top surfaces of the projections 106 and 116 are flat, but the sidewalls of the recesses 108 and 118 are angled with respect to the bottoms of the recesses 108 and 118 and the top surfaces of the projections 106 and 116. The result is recesses 108 and 118 (and corresponding projections 106 and 116) that are tapered; in the particular embodiment illustrated in FIG. 10, the recesses 108 and 118 narrow towards the bottom of the recesses 108 and 118, and the projections 106 and 116 narrow towards the top surfaces of the projections 106 and 116. The projections 116 of the second plate 114 extend into the recesses 108 of the first plate 104 without contacting the first plate 104, and a dielectric material 110 is disposed between the first plate 104 and the second plate 114.

In the embodiment of FIG. 11, the bottoms of the recesses 108 and 118, the sidewalls of the recesses 108 and 118, and the top surfaces of the projections 106 and 116 have some curvature, with the sidewalls of the recesses 108 and 118 angled with respect to the bottoms of the recesses 108 and 118 and the top surfaces of the projections 106 and 116. The result is recesses 108 and 118 (and corresponding projections 106 and 116) that are tapered; in the particular embodiment illustrated in FIG. 11, the recesses 108 and 118 narrow towards the bottom of the recesses 108 and 118, and the projections 106 and 116 narrow towards the top surfaces of the projections 106 and 116. No corners may delineate the top surfaces of the projections 106 and 116 from the sidewalls of the recesses 108 and 118, nor the sidewalls of the recesses 108 and 118 from the bottoms of the recesses 108 and 118. The projections 116 of the second plate 114 extend into the recesses 108 of the first plate 104 without contacting the first plate 104, and a dielectric material 110 is disposed between the first plate 104 and the second plate 114. Embodiments in which the bottoms of the recesses 108 and 118, and the top surfaces of the projections 106 and 116, are curved (instead of terminating at right angles) may be easier to seal from current leakage, and thus may exhibit improved performance.

FIG. 12 is a flow diagram of a method 1200 of manufacturing an electronic component having a three-dimensional capacitor in a metallization stack, in accordance with various embodiments. Although the operations of the method 1200 may be illustrated with reference to the capacitor 102 in the metallization stack 100, the method 1200 may be used to form any suitable capacitor in a metallization stack. Operations are illustrated once each and in a particular order in FIG. 12, but the operations may be reordered and/or repeated as desired (e.g., with different operations performed in parallel when manufacturing multiple electronic components simultaneously).

At 1202, a first plate in a metallization stack may be formed. The first plate may have a recess. For example, the first plate 104 may be formed in the metallization stack 100, and may have a recess 108 (e.g., as discussed above with reference to FIGS. 6 and 7).

At 1204, a dielectric material may be provided on the first plate. For example, the dielectric material 110 may be provided on the first plate 104 (e.g., as discussed above with reference to FIG. 8).

At 1206, a second plate may be formed in the metallization stack on the dielectric material of 1204. The second plate may have a projection extending into the recess and spaced apart from the first plate (of 1202) by the dielectric material (of 1204). For example, the second plate 114 may be formed on the dielectric material 110, and may have a projection 116 extending into a recess 108 without contacting the first plate 104 (e.g., as discussed above with reference to FIG. 9).

The capacitors 102 disclosed herein may be included in the metallization stack of any suitable electronic component. FIGS. 13-16 illustrate various examples of apparatuses that may be included in an electronic component having a metallization stack 100 with one or more of any of the capacitors 102 disclosed herein, or that may include a metallization stack including one or more of any of the capacitors 102 disclosed herein.

Figure 13A:
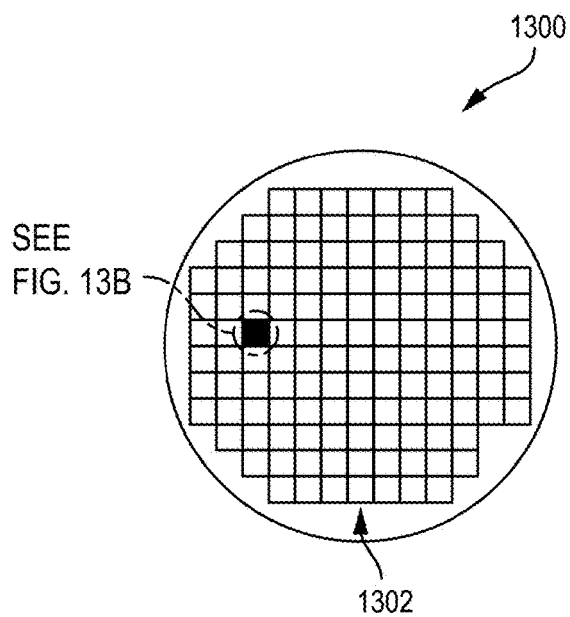
FIGS. 13A and 13B are top views of a wafer and dies that may include a three-dimensional capacitor in a metallization stack or may be included in an IC package having a three-dimensional capacitor in the package metallization stack, in accordance with any of the embodiments disclosed herein.
Figure 13B:
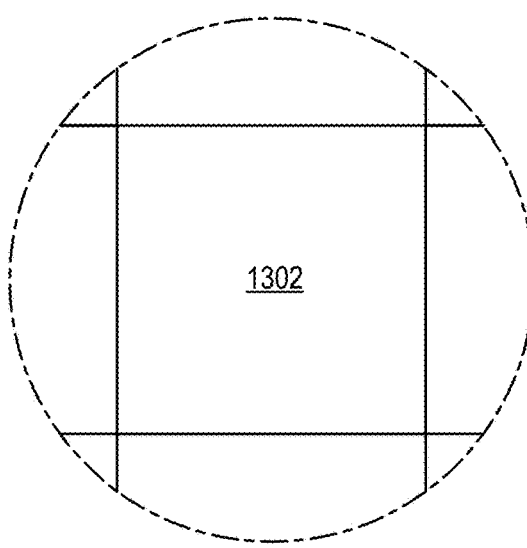

FIGS. 13A-B are top views of a wafer 1300 and dies 1302 that may include a metallization stack 100 with one or more capacitors 102, or may be included in an IC package 150 (e.g., in a die 158) in accordance with any of the embodiments disclosed herein. The wafer 1300 may be composed of semiconductor material and may include one or more dies 1302 having IC structures formed on a surface of the wafer 1300. Each of the dies 1302 (which may be used as a die 158 in an IC package 150) may be a repeating unit of a semiconductor product that includes any suitable IC. After the fabrication of the semiconductor product is complete, the wafer 1300 may undergo a singulation process in which each of the dies 1302 is separated from one another to provide discrete "chips" of the semiconductor product. The die 1302 may include one or more transistors (e.g., some of the transistors 1440 of FIG. 14, discussed below) and/or supporting circuitry to route electrical signals to the transistors, as well as any other IC components. In some embodiments, the wafer 1300 or the die 1302 may include a memory device (e.g., a static random access memory (SRAM) device), a logic device (e.g., an AND, OR, NAND, or NOR gate), or any other suitable circuit element. Multiple ones of these devices may be combined on a single die 1302. For example, a memory array formed by multiple memory devices may be formed on a same die 1302 as a processing device (e.g., the processing device 1602 of FIG. 16) or other logic that is configured to store information in the memory devices or execute instructions stored in the memory array.

Figure 14:
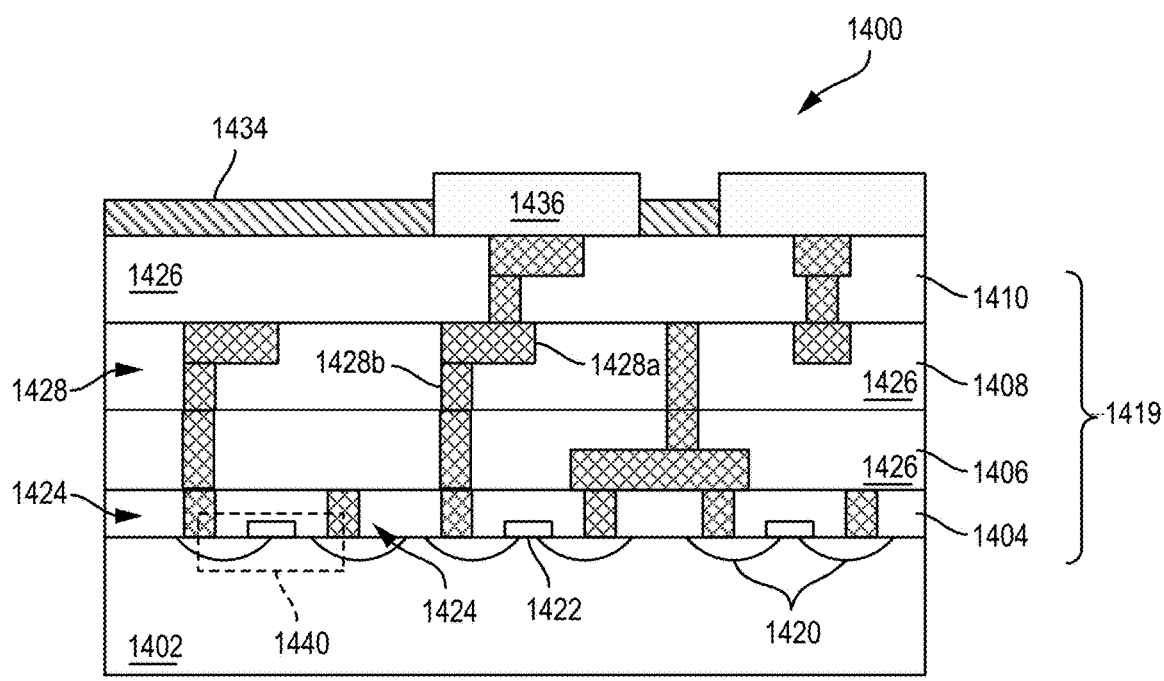
FIG. 14 is a cross-sectional side view of an IC device that may include a three-dimensional capacitor in a metallization layer or may be included in an IC package having a three-dimensional capacitor in the package metallization stack, in accordance with any of the embodiments disclosed herein.

FIG. 14 is a cross-sectional side view of an IC device 1400 that may include a metallization stack 100 with one or more capacitors 102, or may be included in an IC package 150 having a capacitor 102 in a metallization stack 100 (e.g., in a package redistribution layer), in accordance with any of the embodiments disclosed herein. For example, one or more of the IC devices 1400 may be included in one or more dies 158. The IC device 1400 may be formed on a substrate 1402 (e.g., the wafer 1300 of FIG. 13A) and may be included in a die (e.g., the die 1302 of FIG. 13B). The substrate 1402 may be a semiconductor substrate composed of semiconductor material systems including, for example, N-type or P-type materials systems. The substrate 1402 may include, for example, a crystalline substrate formed using a bulk silicon or a silicon-on-insulator substructure. In some embodiments, the semiconductor substrate 1402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1402. Although a few examples of materials from which the substrate 1402 may be formed are described here, any material that may serve as a foundation for an IC device 1400 may be used. The substrate 1402 may be part of a singulated die (e.g., the dies 1302 of FIG. 13B) or a wafer (e.g., the wafer 1300 of FIG. 13A).

The IC device 1400 may include one or more device layers 1404 disposed on the substrate 1402. The device layer 1404 may include features of one or more transistors 1440 (e.g., metal oxide semiconductor field-effect transistors (MOSFETs)) formed on the substrate 1402. The device layer 1404 may include, for example, one or more source and/or drain (S/D) regions 1420, a gate 1422 to control current flow in the transistors 1440 between the S/D regions 1420, and one or more S/D contacts 1424 to route electrical signals to/from the S/D regions 1420. The transistors 1440 may include additional features not depicted for the sake of clarity, such as device isolation regions, gate contacts, and the like. The transistors 1440 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1440 may include a gate 1422 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work function metal or N-type work function metal, depending on whether the transistor 1440 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross-section of the transistor 1440 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1420 may be formed within the substrate 1402 adjacent to the gate 1422 of each transistor 1440. The S/D regions 1420 may be formed using either an implantation/diffusion process or an etching/deposition process, for example. In the former process, dopants such as boron, aluminum, antimony, phosphorous, or arsenic may be ion-implanted into the substrate 1402 to form the S/D regions 1420. An annealing process that activates the dopants and causes them to diffuse farther into the substrate 1402 may follow the ion-implantation process. In the latter process, the substrate 1402 may first be etched to form recesses at the locations of the S/D regions 1420. An epitaxial deposition process may then be carried out to fill the recesses with material that is used to fabricate the S/D regions 1420. In some implementations, the S/D regions 1420 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1420 may be formed using one or more alternate semiconductor materials such as germanium or a group III-V material or alloy. In further embodiments, one or more layers of metal and/or metal alloys may be used to form the S/D regions 1420.

Electrical signals, such as power and/or input/output (I/O) signals, may be routed to and/or from the transistors 1440 of the device layer 1404 through one or more interconnect layers disposed on the device layer 1404 (illustrated in FIG. 14 as interconnect layers 1406-1410). For example, electrically conductive features of the device layer 1404 (e.g., the gate 1422 and the S/D contacts 1424) may be electrically coupled with the interconnect structures 1428 of the interconnect layers 1406-1410. The one or more interconnect layers 1406-1410 may form an interlayer dielectric (ILD) stack 1419 of the IC device 1400. In some embodiments, the interconnect layers 1406-1410 may provide the metallization stack 100, and one or more capacitors 102 (not shown) may be disposed in the interconnect layers 1406, in accordance with any of the techniques disclosed herein. For example, the first plate 104 may be included in one of the interconnect layers 1406-1410, and the second plate 114 may be included in another one of the interconnect layers 1406-1410. One or more capacitors 102 in the ILD stack 1419 may be coupled to any suitable ones of the devices in the device layer 1404, and/or to one or more of the bond pads 1436 (discussed below).

The interconnect structures 1428 may be arranged within the interconnect layers 1406-1410 to route electrical signals according to a wide variety of designs (in particular, the arrangement is not limited to the particular configuration of interconnect structures 1428 depicted in FIG. 14). Although a particular number of interconnect layers 1406-1410 is depicted in FIG. 14, embodiments of the present disclosure include IC devices having more or fewer interconnect layers than depicted.

In some embodiments, the interconnect structures 1428 may include trench structures 1428*a* (sometimes referred to as "lines") and/or via structures 1428*b* (sometimes referred to as "holes") filled with an electrically conductive material such as a metal. The trench structures 1428*a* may be arranged to route electrical signals in a direction of a plane that is substantially parallel with a surface of the substrate 1402 upon which the device layer 1404 is formed. For example, the trench structures 1428*a* may route electrical signals in a direction in and out of the page from the perspective of FIG. 14. The via structures 1428*b* may be arranged to route electrical signals in a direction of a plane that is substantially perpendicular to the surface of the substrate 1402 upon which the device layer 1404 is formed. In some embodiments, the via structures 1428*b* may electrically couple trench structures 1428*a* of different interconnect layers 1406-1410 together.

The interconnect layers 1406-1410 may include a dielectric material 1426 disposed between the interconnect structures 1428, as shown in FIG. 14. In some embodiments, the dielectric material 1426 disposed between the interconnect structures 1428 in different ones of the interconnect layers 1406-1410 may have different compositions; in other embodiments, the composition of the dielectric material 1426 between different interconnect layers 1406-1410 may be the same.

A first interconnect layer 1406 (referred to as Metal 1 or "M1") may be formed directly on the device layer 1404. In some embodiments, the first interconnect layer 1406 may include trench structures 1428a and/or via structures 1428b, as shown. The trench structures 1428a of the first interconnect layer 1406 may be coupled with contacts (e.g., the S/D contacts 1424) of the device layer 1404.

A second interconnect layer 1408 (referred to as Metal 2 or "M2") may be formed directly on the first interconnect layer 1406. In some embodiments, the second interconnect layer 1408 may include via structures 1428b to couple the trench structures 1428a of the second interconnect layer 1408 with the trench structures 1428a of the first interconnect layer 1406. Although the trench structures 1428a and the via structures 1428b are structurally delineated with a line within each interconnect layer (e.g., within the second interconnect layer 1408) for the sake of clarity, the trench structures 1428a and the via structures 1428b may be structurally and/or materially contiguous (e.g., simultaneously filled during a dual-damascene process) in some embodiments.

A third interconnect layer 1410 (referred to as Metal 3 or "M3") (and additional interconnect layers, as desired) may be formed in succession on the second interconnect layer 1408 according to similar techniques and configurations described in connection with the second interconnect layer 1408 or the first interconnect layer 1406. In some embodiments, the interconnect layers that are "higher up" in the IC device 1400 may be thicker, and may be particularly advantageous for forming the plates 104 and 114 of the capacitor 102.

The IC device 1400 may include a solder resist material 1434 (e.g., polyimide or similar material) and one or more bond pads 1436 formed on the interconnect layers 1406-1410. The bond pads 1436 may be electrically coupled with the interconnect structures 1428 and configured to route the electrical signals of the transistor(s) 1440 to other external devices. For example, solder bonds may be formed on the one or more bond pads 1436 to mechanically and/or electrically couple a chip including the IC device 1400 with another component (e.g., a circuit board). The IC device 1400 may have other alternative configurations to route the electrical signals from the interconnect layers 1406-1410 than depicted in other embodiments. For example, the bond pads 1436 may be replaced by or may further include other analogous features (e.g., posts) that route the electrical signals to external components.

Figure 15:
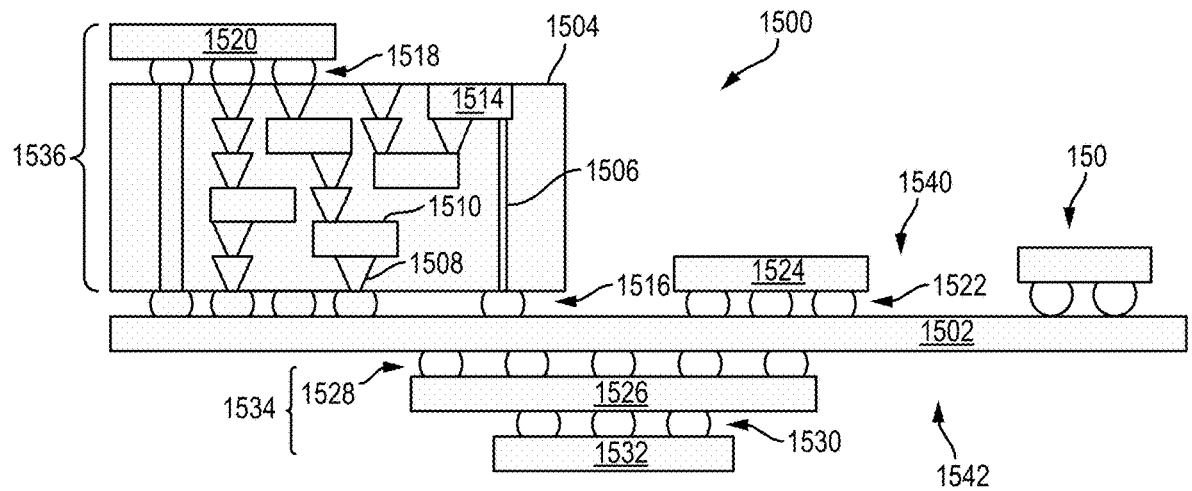
FIG. 15 is a cross-sectional side view of an IC device assembly that may include an electronic component having a three-dimensional capacitor in a metallization stack, in accordance with any of the embodiments disclosed herein.

FIG. 15 is a cross-sectional side view of an IC device assembly 1500 that may include an IC package 150 including a capacitor 102 in a metallization stack 100 (e.g., in a package redistribution layer), and/or another electronic component (e.g., a die) having a capacitor 102 in a metallization stack 100, in accordance with any of the embodiments disclosed herein. The IC device assembly 1500 includes a number of components disposed on a circuit board 1502 (which may be, e.g., a motherboard). The IC device assembly 1500 includes components disposed on a first face 1540 of the circuit board 1502 and an opposing second face 1542 of the circuit board 1502; generally, components may be disposed on one or both faces 1540 and 1542. Any of the IC packages discussed below with reference to the IC device assembly 1500 may include one or more capacitors 102 disposed in a metallization stack 100 (e.g., of a die or of the IC package).

In some embodiments, the circuit board 1502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1502. In other embodiments, the circuit board 1502 may be a non-PCB substrate.

The IC device assembly 1500 illustrated in FIG. 15 includes a package-on-interposer structure 1536 coupled to the first face 1540 of the circuit board 1502 by coupling components 1516. The coupling components 1516 may electrically and mechanically couple the package-on-interposer structure 1536 to the circuit board 1502, and may include solder balls (as shown in FIG. 15), male and female portions of a socket, an adhesive, an underfill material, and/or any other suitable electrical and/or mechanical coupling structure.

The package-on-interposer structure 1536 may include an IC package 1520 coupled to an interposer 1504 by coupling components 1518. The coupling components 1518 may take any suitable form for the application, such as the forms discussed above with reference to the coupling components 1516. Although a single IC package 1520 is shown in FIG. 15, multiple IC packages may be coupled to the interposer 1504; indeed, additional interposers may be coupled to the interposer 1504. The interposer 1504 may provide an intervening substrate used to bridge the circuit board 1502 and the IC package 1520. The IC package 1520 may be or include, for example, a die (the die 1302 of FIG. 13B), an IC device (e.g., the IC device 1400 of FIG. 14), or any other suitable component. Generally, the interposer 1504 may spread a connection to a wider pitch or reroute a connection to a different connection. For example, the interposer 1504 may couple the IC package 1520 (e.g., a die) to a ball grid array (BGA) of the coupling components 1516 for coupling to the circuit board 1502. In the embodiment illustrated in FIG. 15, the IC package 1520 and the circuit board 1502 are attached to opposing sides of the interposer 1504; in other embodiments, the IC package 1520 and the circuit board 1502 may be attached to a same side of the interposer 1504. In some embodiments, three or more components may be interconnected by way of the interposer 1504. In some embodiments, the IC package 1520 may take the form of any of the IC packages 150 disclosed herein.

The interposer 1504 may be formed of an epoxy resin, a fiberglass-reinforced epoxy resin, a ceramic material, or a polymer material such as polyimide. In some embodiments, the interposer 1504 may be formed of alternate rigid or flexible materials that may include the same materials described above for use in a semiconductor substrate, such as silicon, germanium, and other group III-V and group IV materials. The interposer 1504 may include metal interconnects 1508 and vias 1510, including but not limited to through-silicon vias (TSVs) 1506. The interposer 1504 may further include embedded devices 1514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1504. The package-on-interposer structure 1536 may take the form of any of the package-on-interposer structures known in the art.

The IC device assembly 1500 may include an IC package 1524 coupled to the first face 1540 of the circuit board 1502 by coupling components 1522. The coupling components 1522 may take the form of any of the embodiments discussed above with reference to the coupling components 1516, and the IC package 1524 may take the form of any of the embodiments discussed above with reference to the IC package 1520. In some embodiments, the IC package 1524 may take the form of any of the IC packages 150 disclosed herein. The IC device assembly 1500 may also include an IC package 150, in accordance with any of the embodiments disclosed herein.

The IC device assembly 1500 illustrated in FIG. 15 includes a package-on-package structure 1534 coupled to the second face 1542 of the circuit board 1502 by coupling components 1528. The package-on-package structure 1534 may include an IC package 1526 and an IC package 1532 coupled together by coupling components 1530 such that the IC package 1526 is disposed between the circuit board 1502 and the IC package 1532. The coupling components 1528 and 1530 may take the form of any of the embodiments of the coupling components 1516 discussed above, and the IC packages 1526 and 1532 may take the form of any of the embodiments of the IC package 1520 discussed above. The package-on-package structure 1534 may be configured in accordance with any of the package-on-package structures known in the art. In some embodiments, the IC package 1526 and/or the IC package 1532 may take the form of any of the IC packages 150 disclosed herein.

Figure 16:
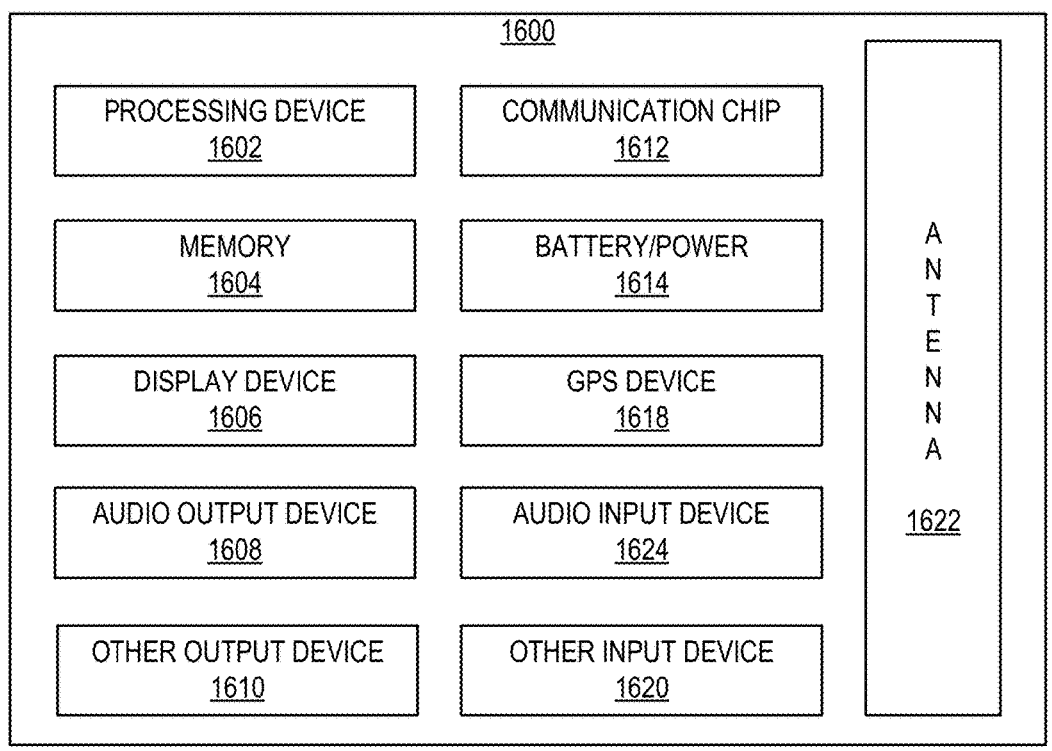
FIG. 16 is a block diagram of an example computing device that may include a three-dimensional capacitor in a metallization stack of an electronic component, in accordance with any of the embodiments disclosed herein.

FIG. 16 is a block diagram of an example computing device 1600 that may include one or more IC packages 150 having one or more capacitors 102 disposed in a metallization stack 100 (e.g., in the package redistribution layer), or one or more other electronic components having one or more capacitors 102 disposed in a metallization stack, in accordance with any of the embodiments disclosed herein. For example, any suitable ones of the components of the computing device 1600 may include one or more of the IC packages 150 disclosed herein. A number of components are illustrated in FIG. 16 as included in the computing device 1600, but any one or more of these components may be omitted or duplicated, as suitable for the application. In some embodiments, some or all of the components included in the computing device 1600 may be attached to one or more motherboards. In some embodiments, some or all of these components are fabricated onto a single system-on-a-chip (SoC) die.

Additionally, in various embodiments, the computing device 1600 may not include one or more of the components illustrated in FIG. 16, but the computing device 1600 may include interface circuitry for coupling to the one or more components. For example, the computing device 1600 may not include a display device 1606, but may include display device interface circuitry (e.g., a connector and driver circuitry) to which a display device 1606 may be coupled. In another set of examples, the computing device 1600 may not include an audio input device 1624 or an audio output device 1608, but may include audio input or output device interface circuitry (e.g., connectors and supporting circuitry) to which an audio input device 1624 or audio output device 1608 may be coupled.

The computing device 1600 may include a processing device 1602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1600 may include a memory 1604, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1604 may include memory that shares a die with the processing device 1602. This memory may be used as cache memory and may include embedded dynamic random access memory (eDRAM) or spin transfer torque magnetic random-access memory (STT-MRAM).

In some embodiments, the computing device 1600 may include a communication chip 1612 (e.g., one or more communication chips). For example, the communication chip 1612 may be configured for managing wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1612 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 1612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1612 may operate in accordance with other wireless protocols in other embodiments. The computing device 1600 may include an antenna 1622 to facilitate wireless communications and/or to receive other wireless communications (such as AM or FM radio transmissions).

In some embodiments, the communication chip 1612 may manage wired communications, such as electrical, optical, or any other suitable communication protocols (e.g., the Ethernet). As noted above, the communication chip 1612 may include multiple communication chips. For instance, a first communication chip 1612 may be dedicated to shorter-range wireless communications such as Wi-Fi or Bluetooth, and a second communication chip 1612 may be dedicated to longer-range wireless communications such as GPS, EDGE, GPRS, CDMA, WiMAX, LTE, EV-DO, or others. In some embodiments, a first communication chip 1612 may be dedicated to wireless communications, and a second communication chip 1612 may be dedicated to wired communications.

The computing device 1600 may include battery/power circuitry 1614. The battery/power circuitry 1614 may include one or more energy storage devices (e.g., batteries or capacitors) and/or circuitry for coupling components of the computing device 1600 to an energy source separate from the computing device 1600 (e.g., AC line power).

The computing device 1600 may include a display device 1606 (or corresponding interface circuitry, as discussed above). The display device 1606 may include any visual indicators, such as a heads-up display, a computer monitor, a projector, a touchscreen display, a liquid crystal display (LCD), a light-emitting diode display, or a flat panel display, for example.

The computing device 1600 may include an audio output device 1608 (or corresponding interface circuitry, as discussed above). The audio output device 1608 may include any device that generates an audible indicator, such as speakers, headsets, or earbuds, for example.

The computing device 1600 may include an audio input device 1624 (or corresponding interface circuitry, as discussed above). The audio input device 1624 may include any device that generates a signal representative of a sound, such as microphones, microphone arrays, or digital instruments (e.g., instruments having a musical instrument digital interface (MIDI) output).

The computing device 1600 may include a global positioning system (GPS) device 1618 (or corresponding interface circuitry, as discussed above). The GPS device 1618 may be in communication with a satellite-based system and may receive a location of the computing device 1600, as known in the art.

The computing device 1600 may include an other output device 1610 (or corresponding interface circuitry, as discussed above). Examples of the other output device 1610 may include an audio codec, a video codec, a printer, a wired or wireless transmitter for providing information to other devices, or an additional storage device.

The computing device 1600 may include an other input device 1620 (or corresponding interface circuitry, as discussed above). Examples of the other input device 1620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1600 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1600 may be any other electronic device that processes data.

The following paragraphs provide various examples of the embodiments disclosed herein.

Example 1 is an electronic component, including: a metallization stack; and a capacitor disposed in the metallization stack, wherein the capacitor includes a first conductive plate having a plurality of recesses, and a second conductive plate having a plurality of projections, wherein individual projections of the plurality of projections of the second conductive plate extend into corresponding individual recesses of the plurality of recesses without contacting the first conductive plate.

Example 2 may include the subject matter of Example 1, and may further specify that the first conductive plate has a plurality of projections, and the plurality of recesses and the plurality of projections of the first conductive plate alternate in the first conductive plate in a parallel ridge pattern.

Example 3 may include the subject matter of Example 2, and may further specify that the first conductive plate has a plurality of projections, and the plurality of recesses and the plurality of projections of the first conductive plate alternate in the first conductive plate in a checkerboard pattern.

Example 4 may include the subject matter of any of Examples 1-3, and may further include a dielectric material extending between the first conductive plate and the second conductive plate.

Example 5 may include the subject matter of any of Examples 1-4, and may further specify that individual ones of the plurality of recesses are tapered.

Example 6 may include the subject matter of Example 5, and may further specify that individual ones of the plurality of projections are tapered.

Example 7 may include the subject matter of any of Examples 1-6, and may further specify that the first and second conductive plates are spaced apart by a maximum distance between 5 and 10 microns.

Example 8 may include the subject matter of any of Examples 1-7, and may further specify that the metallization stack is a package redistribution layer.

Example 9 may include the subject matter of Example 8, and may further specify that the electronic component is an embedded wafer level ball grid array (eWLB) package.

Example 10 may include the subject matter of Example 9, and may further specify that: the electronic component includes a mold compound having a fanout area; and the capacitor is disposed in the package redistribution layer below the fanout area.

Example 11 may include the subject matter of Example 8, and may further specify that the electronic component is a flip chip (FC) package.

Example 12 may include the subject matter of any of Examples 8-11, and may further specify that the electronic component has a height less than 1 millimeter.

Example 13 may include the subject matter of any of Examples 1-7, and may further specify that the metallization layer includes back-end metal in a die.

Example 14 may include the subject matter of Example 13, and may further include a bond pad electrically coupled to the capacitor.

Example 15 is a computing device, including: a circuit board; and an integrated circuit (IC) package coupled to the circuit board, wherein the IC package includes a redistribution layer, a die, including a memory device or a processing device, coupled to the redistribution layer, and a capacitor disposed in the redistribution layer, wherein the capacitor includes a first conductive plate having a recess, and a second conductive plate having a projection, wherein the projection extends into the recess without contacting the recess.

Example 16 may include the subject matter of Example 15, and may further specify that the die includes a power management IC (PMIC).

Example 17 may include the subject matter of any of Examples 15-16, and may further specify that the circuit board is a motherboard.

Example 18 may include the subject matter of any of Examples 15-17, and may further specify that the computing device is a smartphone.

Example 19 may include the subject matter of any of Examples 15-18, and may further specify that the computing device is a tablet computing device.

Example 20 is a method of manufacturing an electronic component having a three-dimensional capacitor in a metallization stack, including: forming a first conductive plate in the metallization stack, wherein the first conductive plate has a recess; providing a dielectric material on the first conductive plate; and forming a second conductive plate in the metallization stack on the dielectric material, wherein the second plate has a projection extending into the recess and spaced apart from the first conductive plate by the dielectric material.

Example 21 may include the subject matter of Example 20, and may further specify that providing the dielectric material includes spray-coating the dielectric material onto the first conductive plate.

Example 22 may include the subject matter of Example 20, and may further specify that providing the dielectric material includes providing a conformal layer of the dielectric material onto the first conductive plate.

Example 23 may include the subject matter of any of Examples 20-22, and may further include providing first and second dielectric layers in the metallization stack such that the first and second conductive plates are both disposed between the first and second dielectric layers.

Example 24 may include the subject matter of any of Examples 20-23, and may further specify that the metallization stack is a package redistribution layer, and the method further includes forming conductive pathways between the first and second conductive plates and first and second conductive contacts of a die coupled to the package redistribution layer.

Example 25 may include the subject matter of Example 24, and may further include providing a mold compound in contact with the die and the package redistribution layer.

The invention claimed is:

1. An electronic component, comprising:
a metallization stack; and
a capacitor disposed in the metallization stack, wherein the capacitor includes:
   a first conductive plate having a plurality of recesses and a plurality of projections, and the plurality of recesses and the plurality of projections of the first conductive plate alternate in the first conductive plate in a checkerboard pattern, and
   a second conductive plate having a plurality of projections, wherein individual projections of the plurality of projections of the second conductive plate extend into corresponding individual recesses of the plurality of recesses of the first conductive plate without contacting the first conductive plate.

2. The electronic component of claim 1, further comprising:
a dielectric material between the first conductive plate and the second conductive plate, wherein the dielectric material is conformal over the first conductive plate.

3. The electronic component of claim 2, wherein the first and second conductive plates are spaced apart by a maximum distance between 5 microns and 10 microns.

4. The electronic component of claim 3, wherein the dielectric material has a thickness between 5 microns and 10 microns.

5. The electronic component of claim 1, wherein individual ones of the plurality of recesses are tapered.

6. The electronic component of claim 5, wherein individual ones of the plurality of projections are tapered.

7. The electronic component of claim 1, wherein the metallization stack is a package redistribution layer.

8. The electronic component of claim 7, wherein the electronic component is an embedded wafer level ball grid array (eWLB) package.

9. The electronic component of claim 8, wherein:
the electronic component includes a mold compound having a fanout area; and
the capacitor is disposed in the package redistribution layer below the fanout area.

10. The electronic component of claim 7, wherein the electronic component is a flip chip (FC) package.

11. The electronic component of claim 7, wherein the electronic component has a height less than 1 millimeter.

12. The electronic component of claim 1, wherein the metallization stack includes back-end metal in a die.

13. The electronic component of claim 12, further comprising:
a bond pad electrically coupled to the capacitor.

14. A computing device, comprising: a circuit board; and an integrated circuit (IC) package coupled to the circuit board, wherein the IC package includes: a redistribution layer, a die, including a memory device or a processing device, coupled to the redistribution layer, and a capacitor disposed in the redistribution layer, wherein the capacitor includes: a first conductive plate having a plurality of first projection portions and a plurality of first recess portions defined between adjacent ones of the first projection portions, wherein the first projection portions and the first recess portions are arranged in a two-dimensional array, the two-dimensional array includes a row having at least one first projection portion and at least one first recess portion, and the two-dimensional array includes a column having at least one first projection portion and at least one first recess portion, and a second conductive plate having a plurality of second projection portions arranged in a two-dimensional array, wherein individual ones of the second projection portions extend into a corresponding individual one of the first recess portions without contacting the first conductive plate, and pairs of adjacent second projection portions have a single one of the first projection portions between the second projection portions in the pair.

15. The computing device of claim 14, wherein the die includes a power management IC (PMIC).

16. The computing device of claim 14, wherein the circuit board is a motherboard.

17. The computing device of claim 14, wherein the computing device is a smartphone.

18. The computing device of claim 14, wherein the computing device is a tablet computing device.

19. The computing device of claim 14, wherein pairs of adjacent first projection portions have a single one of the second projection portions between the first projection portions in the pair.

20. The computing device of claim 14, wherein the capacitor further includes:
a dielectric material between the first conductive plate and the second conductive plate, wherein the dielectric material is conformal over the first conductive plate.

21. An electronic component, comprising: a metallization stack; and a capacitor disposed in the metallization stack, wherein the capacitor includes: a first conductive plate having a plurality of first projection portions and a plurality of first recess portions arranged in a two-dimensional arrangement, wherein the two-dimensional arrangement includes a first axis and a second axis, at least one first projection portion and at least one first recess portion are distributed along the first axis, and at least one first projection portion and at least one first recess portion are distributed along the second axis, a second conductive plate having a plurality of second projection portions arranged in a two-dimensional arrangement, wherein individual ones of the second projection portions extend into corresponding individual ones of the first recess portions without contacting the first conductive plate, and a dielectric material between the first conductive plate and the second conductive plate, wherein the dielectric material is conformal over the first conductive plate.

22. The electronic component of claim 21, wherein the dielectric material has a thickness between 5 microns and 10 microns.

23. The electronic component of claim 22, wherein the first and second conductive plates are spaced apart by a maximum distance between 5 and 10 microns.

24. The electronic component of claim 21, wherein, individual ones of the second projection portions extend into a corresponding individual one of the first recess portions without contacting the first conductive plate, and pairs of adjacent second projection portions have a single one of the first projection portions between the second projection portions in the pair.

25. The electronic component of claim 21, wherein the capacitor is included in a redistribution layer of the electronic component.

\* \* \* \* \*